(12) United States Patent
Kong et al.

(10) Patent No.: US 9,281,051 B2
(45) Date of Patent: Mar. 8, 2016

(54) SEMICONDUCTOR PACKAGE

(71) Applicant: SK hynix Inc., Icheon-si, Gyeonggi-do (KR)

(72) Inventors: Kyu Bong Kong, Suwon-si (KR); Kwang Jin Na, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/517,565

(22) Filed: Oct. 17, 2014

(65) Prior Publication Data

US 2015/0380075 A1 Dec. 31, 2015

(30) Foreign Application Priority Data

Jun. 26, 2014 (KR) .................. 10-2014-0078887

(51) Int. Cl.
| | |
|---|---|
| *G11C 11/34* | (2006.01) |
| *G11C 11/4096* | (2006.01) |
| *G11C 7/10* | (2006.01) |
| *G11C 5/02* | (2006.01) |
| *G11C 5/06* | (2006.01) |

(52) U.S. Cl.
CPC ............ *G11C 11/4096* (2013.01); *G11C 5/025* (2013.01); *G11C 5/066* (2013.01); *G11C 7/1006* (2013.01)

(58) Field of Classification Search
CPC ... G11C 8/12; G11C 16/20; G11C 2029/4002
USPC .............................. 365/174, 230.01, 230.03
See application file for complete search history.

(56) References Cited

U.S. PATENT DOCUMENTS

| | | | | |
|---|---|---|---|---|
| 2009/0150731 | A1* | 6/2009 | Kim ............... | G01R 31/318572 714/727 |
| 2012/0018623 | A1 | 1/2012 | Dinc et al. | |
| 2012/0069685 | A1* | 3/2012 | Ide ...................... | G11C 29/787 365/189.05 |
| 2012/0294058 | A1 | 11/2012 | Best et al. | |

* cited by examiner

*Primary Examiner* — Han Yang

(74) *Attorney, Agent, or Firm* — William Park & Associates Ltd.

(57) ABSTRACT

A semiconductor package may include a first die and a second die disposed adjacent to the first die. The semiconductor package may include a plurality of pads configured for receiving and outputting data mask addresses. The semiconductor package may include mapping blocks configured to map data mask signals among the first die, the second die, and the plurality of pads in response to a received address.

17 Claims, 3 Drawing Sheets

# SEMICONDUCTOR PACKAGE

CROSS-REFERENCES TO RELATED APPLICATION

The present application claims priority under 35 U.S.C. §119(a) to Korean application number 10-2014-0078887, filed on Jun. 26, 2014, in the Korean Intellectual Property Office, which is incorporated herein by reference in its entirety.

BACKGROUND

1. Technical Field

Various embodiments generally relate to semiconductor packages, and more particularly, to technologies for allowing a same data mask address mapping to be retained even when the design of a package has changed.

2. Related Art

Semiconductor memory devices are continuously being developed to increase their degree of integration and operating speeds. In order to increase an operating speed, a so-called synchronous memory device capable of operating in synchronization with a clock provided from an outside of a memory chip has been used.

An SDR (single data rate) synchronous memory device was first used. The SDR synchronous memory device may input and output one quantity of data through one data pin for one cycle of a clock in synchronization with the rising edge of the clock. The clock may be provided from outside the memory device.

However, the SDR synchronous memory device cannot satisfy the speed of a system requiring high speed operations. Accordingly, a DDR (double data rate) synchronous memory device may be used to process two quantities of data per one cycle of a clock.

In the DDR synchronous memory device, two quantities of data are consecutively inputted and outputted through each data input/output pin, in synchronization with the rising edge and the falling edge of a clock. The clock signal may be inputted from outside the DDR synchronous memory device. Therefore, a bandwidth of at least two times wider than the conventional SDR synchronous memory device may be realized without increasing the frequency of the clock. Thus, a high speed operation may be correspondingly achieved.

Semiconductor devices may be designed to consume less power. Data pattern information signals may be used by being defined as a specification.

In particular, a memory for a high speed operation (for example, the Graphics Double Data Rate version 5 (GDDR5)) capable of receiving addresses at not only the rising edge but also the falling edge of an external clock is being designed. Since it is possible to receive addresses two times per one cycle, the number of address pins may be decreased when compared to a conventional semiconductor memory device. Additionally, an extra number of pins may be connected with a power supply voltage or a ground voltage to increase the operation speed of the semiconductor memory device.

In a semiconductor memory device such as a dynamic random access memory (DRAM), in order to achieve a larger capacity from a unit area, a plurality of semiconductor chips (or dies) are stacked and then packaged.

A semiconductor memory device in which only one semiconductor chip is packaged is referred to as a single die package (SDP). A semiconductor memory device in which two semiconductor chips are stacked and packaged is referred to as a dual die package (DDP). A semiconductor memory device in which four semiconductor chips are stacked and packaged is referred to as a quad die package (QDP).

A semiconductor memory device may have data mask pins for receiving data mask information or may receive data mask information through address pins, according to a specification inherent to each device.

In the case of a dual die package (DDP) in which two dies are packaged together, data mask mapping is differentiated when compared to a single die package (SDP).

In other words, in the dual die package, the two dies share address command pins, but memory core regions of the respective dies operate independently.

SUMMARY

In an embodiment, a semiconductor package may include a first die, a second die disposed adjacent to the first die, and a plurality of pads through which data mask addresses are inputted and outputted. The semiconductor package may also include mapping blocks configured to map data mask signals among the first die, the second die, and the plurality of pads in correspondence to an address which is inputted.

DETAILED DESCRIPTION

Hereinafter, semiconductor packages will be described below with reference to the accompanying drawings through various examples of embodiments.

If data mask mapping is differentiated in the dual die package and the single die package, a controller may perform an additional function of recognizing in advance the difference of the two package types and calculating different data mask mapping. Various embodiments may be directed to a technology for allowing the same data mask address mapping as a single die package (SDP) to be retained even when a dual die package (DDP) is realized.

According to the various embodiments, advantages may be provided in that it may be possible to allow the same data mask address mapping as a single die package (SDP) to be retained even when a dual die package (DDP) is realized.

Figure 1:
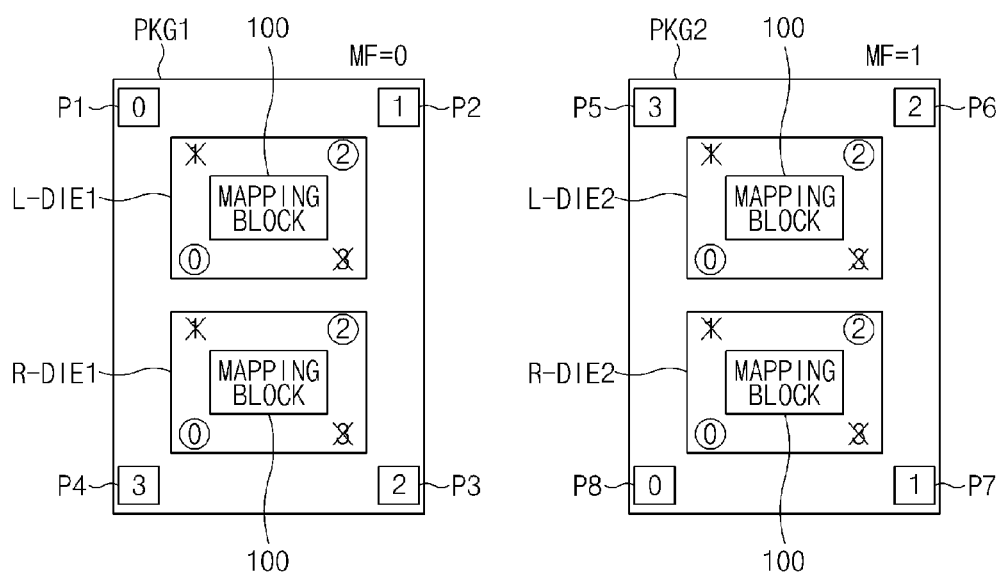
FIG. 1 is a diagram illustrating a representation of examples of the configurations of semiconductor packages in accordance with an embodiment.

FIG. 1 is a diagram illustrating a representation of examples of the configurations of semiconductor packages in accordance with an embodiment.

An embodiment has a plurality of packages PKG1 and PKG2. FIG. 1 illustrates a plan view of the plurality of packages PKG1 and PKG2 when viewed from the top. For example, the plurality of packages PKG1 and PKG2 may be configured by mirror packages and may be capable of mirror functions. The first package PKG1 has a data arrangement structure of a mirror function "MF=O". The second package PKG2 has a data arrangement structure of a mirror function "MF=1".

A semiconductor device such as a double data rate synchronous DRAM (DDR SDRAM) may be developed to include relatively large capacities, high speed operations, and lower power consumption. In order to achieve larger capacities a plurality of memory chips may be used. The plurality of memory chips may be modularized. A module may include a plurality of memory chips mounted to a module substrate and a plurality of connection terminals electrically connected to connectors between the respective memory chips and the module substrate. A module may be classified into a normal package and a mirror package according to the arrangement pattern of the connection terminals.

In the mirror package, when mounting memory chips to a double side module substrate, the arrangement of metal lines formed on both surfaces of the module substrate are symmetrical to each other. The arrangement of the pins of the memory chips may also have symmetrical structures. For this reason, in the case of memory chips having the same pin arrangements, mirror function operations may be performed to make the pin arrangements of the memory chips have symmetrical structures. That is to say, because corresponding pads of the two memory chips may be connected oppositely to each other, it may be necessary to perform the mirror function operations in the chips, for the purpose of reconfiguration.

Through such mirror function operations, for example, two memory chips operating at a X16 speed may be used by being overlapped such that their pins face each other, and thus, one module may operate at a X32 speed.

The first package PKG1 may be configured with a dual die package (DDP). The first package PKG1 may include a first die L-DIE1 and a second die R-DIE1 disposed adjacent to the first die L-DIE1. The first package PKG1 may include plurality of pads P1 to P4 through which data mask addresses may be inputted and outputted.

For example, data "0" of the pad P1 is mapped as data "0" of the first die L-DIE1 and data "1" of the pad P2 is mapped as data "2" of the first die L-DIE1, by which mask information is inputted. Data "1" and data "3" of the first die L-DIE1 are not used. Data "2" of the pad P3 is mapped as data "2" of the second die R-DIE1, and data "3" of the pad P4 is mapped as data "0" of the second die R-DIE1, by which mask information is inputted. Data "1" and data "3" of the second die R-DIE1 are not used.

The second package PKG2 may be configured by a dual die package (DDP). The second package PKG2 may include a first die L-DIE2 and a second die R-DIE2 disposed adjacent to the first die L-DIE2. The second package PKG2 may include a plurality of pads P5 to P8 through which data mask addresses may be inputted and outputted.

For example, data "3" of the pad P5 is mapped as data "0" of the first die L-DIE2 and data "2" of the pad P6 is mapped as data "2" of the first die L-DIE2, by which mask information is inputted. Data "1" and data "3" of the first die L-DIE2 are not used. Data "1" of the pad P7 is mapped as data "2" of the second die R-DIE2, and data "0" of the pad P8 is mapped as data "0" of the second die R-DIE2, by which mask information is inputted. Data "1" and data "3" of the second die R-DIE2 are not used.

Figure 2:
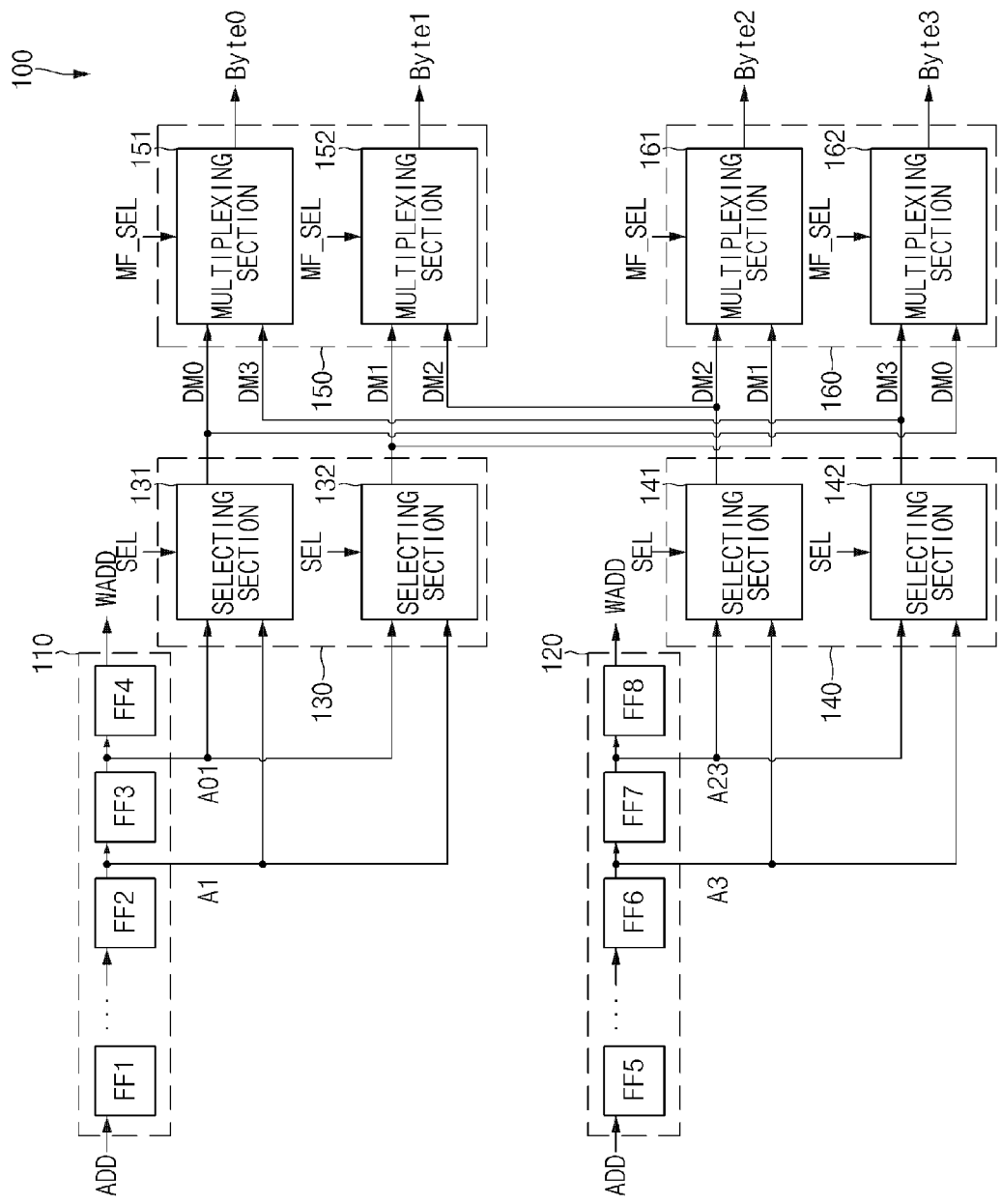
FIG. 2 is a detailed configuration diagram of a representation of the mapping block for mapping a package, illustrated in FIG. 1.

In the plurality of packages PKG1 and PKG2 having such configurations, the mask data of the packages PKG1 and PKG2 may be mapped according to the mapping operations of mapping blocks 100. FIG. 2 is a detailed configuration diagram of a representation of the mapping block 100 for mapping package data, illustrated in FIG. 1. In an embodiment of FIG. 2, the mapping process of the first package PKG1 illustrated in FIG. 1 will be described as an example.

The mapping block 100 may include buffering units 110 and 120, selection units 130 and 140, and multiplexing units 150 and 160. In an embodiment, the mapping block 100 may be disposed, for example, in each of the dies L-DIE1, L-DIE2, R-DIE1 and R-DIE2 in the plurality of packages PKG1 and PKG2.

The buffering unit 110 may include a plurality of flip-flops FF1 to FF4. After the mapping block 100 receives an address, the buffering unit 110 flip-flops the address ADD inputted through the plurality of flip-flops FF1 to FF4. An address A1 may be outputted through the flip-flop FF2, and an address A01 may be outputted through the flip-flop FF3. The address outputted through the flip-flop FF4 belonging to a final stage may be used as a write address WADD.

The buffering unit 120 may include a plurality of flip-flops FF5 to FF8. The buffering unit 120 flip-flops the address ADD inputted through the plurality of flip-flops FF5 to FF8. An address A3 may be outputted through the flip-flop FF6, and an address A23 is outputted through the flip-flop FF7. The address outputted through the flip-flop FF8 belonging to a final stage may be used as the write address WADD.

The selection unit 130 may select the signals applied from the buffering unit 110 according to a select signal SEL, and may output data mask signals DM0 and DM1. For example, a first selecting section 131 may select either the address A1 or the address A01 according to the select signal SEL, and may output the data mask signal DM0. A second selecting section 132 may select either the address A1 or the address A01 according to the select signal SEL, and may output the data mask signal DM1.

The selection unit 140 may select the signals applied from the buffering unit 120 according to the select signal SEL, and may output data mask signals DM2 and DM3. For example, a third selecting section 141 may select either the address A3 or the address A23 according to the select signal SEL, and may output the data mask signal DM2. A fourth selecting section 142 may select either the address A3 or the address A23 according to the select signal SEL, and may output the data mask signal DM3.

The multiplexing unit 150 may select at least two signals among the data mask signals DM0 to DM4 applied from the selection units 130 and 140. The selection may be in accordance with a control signal MF_SEL, and the multiplexing unit 150 may output the data "0" and the data "1".

For example, a first multiplexing section 151 may combine the data mask signal DM0 applied from the first selecting section 131 and the data mask signal DM3 applied from the fourth selecting section 142 according to the control signal MF_SEL, and may output the data "0". A second multiplexing section 152 may combine the data mask signal DM1 applied from the second selecting section 132 and the data mask signal DM2 applied from the third selecting section 141 according to the control signal MF_SEL, and may output the data "1".

The multiplexing unit 160 may select at least two signals among the data mask signals DM0 to DM4 applied from the selection units 130 and 140. The selection may be in accordance with the control signal MF_SEL, and the multiplexing unit 10 may output the data "2" and the data "3".

For example, a third multiplexing section 161 may combine the data mask signal DM2 applied from the third selecting section 141 and the data mask signal DM1 applied from the second selecting section 132 according to the control signal MF_SEL, and may output the data "2". A fourth multiplexing section 162 may combine the data mask signal DM3 applied from the fourth selecting section 142 and the data mask signal DM0 applied from the first selecting section 131 according to the control signal MF_SEL, and may output the data "3".

An example of an operation for mapping the data inputted to the pads P1 to P4 of the first package PKG1 in the mapping block 100 will be described with reference to the following Table 1.

TABLE 1

| DM/MF | Die | Selecting section | Multi-plexing section | Multi-plexing section | DIE | PKG |
|---|---|---|---|---|---|---|
| WDM X32 MF = 0 | L-DIE | A01 | DM0 | | Byte0 | Byte0 |
| | | A01 | X | BT0 | Byte1 | X |
| | | A23 | DM1 | | Byte2 | Byte1 |
| | | A23 | X | BT1 | Byte3 | X |
| WDM X32 MF = 0 | R-DIE | A01 | DM3 | | Byte0 | Byte3 |
| | | A01 | X | BT0 | Byte1 | X |
| | | A23 | DM2 | | Byte2 | Byte2 |
| | | A23 | X | BT1 | Byte3 | X |

In Table 1, WDM means a write double mask mode in which write data mask signals are controlled in pairs in one package PKG1. Since the one package PKG1, for example, includes the two dies L-DIE1 and R-DIE1 each of which has a X16 data width, a data width becomes X32. The mapping operation may be applied to the package PKG1 having the data arrangement structure of the mirror function "MF=0".

First, the example of the mapping operation in the first die L-DIE1 will be described below. In the first die L-DIE1, only the address A01 is enabled, and the address A23 retains a disabled state.

In the example where the first selecting section 131 selects the address A01 in response to the select signal SEL, the data mask signal DM0 is outputted to the first multiplexing section 151. The first multiplexing section 151 outputs the data "0" from the first die L-DIE1 according to the data mask signal DM0. The data "0" of the first die L-DIE1 is mapped with the data "0" in the pad P1 of the first package PKG1.

The data mask signal DM0 is also outputted to the fourth multiplexing section 162. However, the data "3" is not used in the first die L-DIE1. Therefore, the data "3" is not mapped with the pad P2 of the first package PKG1.

In the example where the second selecting section 132 selects the address A01 in response to the select signal SEL, the data mask signal DM1 is outputted to the second multiplexing section 152. The second multiplexing section 152 outputs the data "1" from the first die L-DIE1 according to the data mask signal DM1.

However, as described above, in the WDM, write data mask signals may be controlled in pairs. Thus, for example, in the first die L-DIE1, the data "0" and the data "1" are controlled in a pair. Accordingly, since the data "1" is not used in the first die L-DIE1, the data "1" is not mapped with the pad P1 of the first package PKG1.

The data mask signal DM1 outputted from the second selecting section 132 is outputted to the third multiplexing section 161. Then, the third multiplexing section 161 outputs the data "2" from the first die L-DIE1 according to the data mask signal DM1. The data "2" of the first die L-DIE1 is mapped with the data "1" in the pad P2 of the first package PKG1.

Next, the mapping operation in the second die R-DIE1 will be described below. For example, in the second die R-DIE1, only the address A23 is enabled, and the address A01 retains a disabled state.

In the example where the third selecting section 141 selects the address A23 in response to the select signal SEL, the data mask signal DM2 is outputted to the third multiplexing section 161. The third multiplexing section 161 outputs the data "2" from the second die R-DIE1 according to the data mask signal DM2. The data "2" of the second die R-DIE1 is mapped with the data "2" in the pad P3 of the first package PKG1.

The data mask signal DM2 is also outputted to the second multiplexing section 152. However, the data "1" is not used in the second die R-DIE1. Therefore, the data "1" is not mapped with the pad P4 of the first package PKG1.

In the example where the fourth selecting section 142 selects the address A23 in response to the select signal SEL, the data mask signal DM3 is outputted to the fourth multiplexing section 162. The fourth multiplexing section 162 outputs the data "3" from the second die R-DIE1 according to the data mask signal DM3.

However, as described above, in the WDM, write data mask signals may be controlled in pairs. Thus, for example, in the second die R-DIE1, the data "2" and the data "3" are controlled in a pair. Accordingly, since the data "3" is not used in the second die R-DIE1, the data "3" is not mapped with the pad P3 of the first package PKG1.

The data mask signal DM3 outputted from the fourth selecting section 142 is outputted to the first multiplexing section 151. Then, the first multiplexing section 151 outputs the data "0" from the second die R-DIE1 according to the data mask signal DM3. The data "0" of the second die R-DIE1 is mapped with the data "3" in the pad P4 of the first package PKG1.

For reference, the expression "byte" given in FIG. 2 and Table 1 may represent 4 byte data. For example, in the example where 32 data (DQ) pins are provided, when the 32 data pins are divided by 8, division may be made into 4 byte units. Data respectively corresponding to the 4 byte data are the data "0", the data "1", the data "2" and the data "3" which are inputted to the pads P1 to P4.

On the other hand, an operation for mapping the data inputted to the pads P1 to P4 of the first package PKG1 in the mapping block 100 will be described with reference to the following Table 2.

TABLE 2

| DM/MF | Die | Selecting section | Multi-plexing section | Multi-plexing section | DIE | PKG |
|---|---|---|---|---|---|---|
| WSM X32 MF = 0 | L-DIE | A01 | DM0 | | Byte0 | Byte0 |
| | | A1 | X | BT0 | Byte1 | X |
| | | A23 | DM1 | | Byte2 | Byte1 |
| | | A3 | X | BT1 | Byte3 | X |
| WSM X32 MF = 0 | R-DIE | A01 | DM3 | | Byte0 | Byte3 |
| | | A1 | X | BT0 | Byte1 | X |
| | | A23 | DM2 | | Byte2 | Byte2 |
| | | A3 | X | BT1 | Byte3 | X |

In Table 2, for example, WSM means a write single mask mode in which a write data mask signal is controlled singly in one package PKG1. Since the one package PKG1 includes the two dies L-DIE1 and R-DIE1 each of which has a X16 data width, a data width becomes X32. The mapping operation may be applied to the package PKG1 which has the data arrangement structure of the mirror function "MF=0".

First, the example for the mapping operation in the first die L-DIE1 will be described below. In the first die L-DIE1, only the addresses A01 and A1 are enabled, and the addresses A23 and A3 retain disabled states.

In the example where the first selecting section 131 selects the address A01 in response to the select signal SEL, the data mask signal DM0 is outputted to the first multiplexing section 151. The first multiplexing section 151 outputs the data "0" from the first die L-DIE1 according to the data mask signal DM0. The data "0" of the first die L-DIE1 is mapped with the data "0" in the pad P1 of the first package PKG1.

The data mask signal DM0 is also outputted to the fourth multiplexing section 162. However, the data "3" is not used in the first die L-DIE1. Therefore, the data "3" is not mapped with the pad P2 of the first package PKG1.

In the example where the second selecting section 132 selects the address A1 in response to the select signal SEL, the data mask signal DM1 is outputted to the second multiplexing section 152. The second multiplexing section 152 outputs the data "1" from the first die L-DIE1 according to the data mask signal DM1. However, since the data "1" is not used in the first die L-DIE1, the data "1" is not mapped with the pad P1 of the first package PKG1.

The data mask signal DM1 outputted from the second selecting section 132 is outputted to the third multiplexing section 161. Then, the third multiplexing section 161 outputs the data "2" from the first die L-DIE1 according to the data mask signal DM1. The data "2" of the first die L-DIE1 is mapped with the data "1" in the pad P2 of the first package PKG1.

Next, the example of the mapping operation in the second die R-DIE1 will be described below. In the second die R-DIE1, only the addresses A23 and A3 are enabled, and the addresses A01 and A1 retain disabled states.

In the example where the third selecting section 141 selects the address A23 in response to the select signal SEL, the data mask signal DM2 is outputted to the third multiplexing section 161. The third multiplexing section 161 outputs the data "2" from the second die R-DIE1 according to the data mask signal DM2. The data "2" of the second die R-DIE1 is mapped with the data "2" in the pad P3 of the first package PKG1.

The data mask signal DM2 is also outputted to the second multiplexing section 152. However, the data "1" is not used in the second die R-DIE1. Therefore, the data "1" is not mapped with the pad P4 of the first package PKG1.

In the example where the fourth selecting section 142 selects the address A3 in response to the select signal SEL, the data mask signal DM3 is outputted to the fourth multiplexing section 162. The fourth multiplexing section 162 outputs the data "3" from the second die R-DIE1 according to the data mask signal DM3. However, since the data "3" is not used in the second die R-DIE1, the data "3" is not mapped with the pad P3 of the first package PKG1.

The data mask signal DM3 outputted from the fourth selecting section 142 is outputted to the first multiplexing section 151. Then, the first multiplexing section 151 outputs the data "0" from the second die R-DIE1 according to the data mask signal DM3. The data "0" of the second die R-DIE1 is mapped with the data "3" in the pad P4 of the first package PKG1.

In Table 1 and Table 2, the examples of the mapping operations of the first package PKG1 were described. The mapping operations of the second package PKG2 may be performed by oppositely controlling the mapping operations of the first die L-DIE2 and the second die R-DIE2.

As a consequence, in an embodiment, even when a dual die package (DDP) in which two dies are packaged into one is realized, the same data mask addressing mapping as in a single die package (SDP) may be achieved. In an embodiment, the enable signal of a dual die package and a signal for distinguishing a first die and a second die may be controlled by an external controller.

For reference, the expression "byte" given in FIG. 2 and Table 2 may represent 4 byte data. For example, in the example where 32 data (DQ) pins are provided, when the 32 data pins are divided by 8, division may be made into 4 byte units. Data respectively corresponding to the 4 byte data are the data "3", the data "2", the data "1" and the data "0" which are inputted to the pads P1 to P4.

Figure 3:
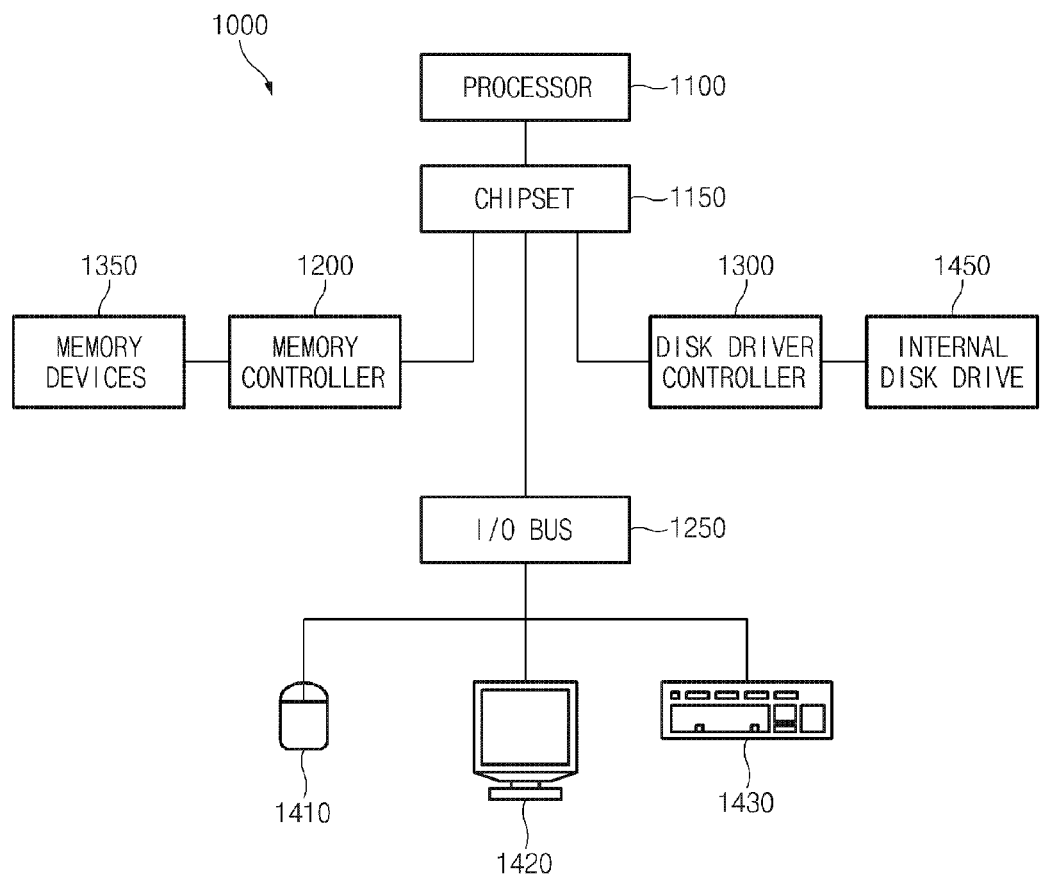
FIG. 3 illustrates a block diagram of an example of a representation of a system employing the semiconductor packages in accordance with the embodiments discussed above with relation to FIGS. 1-2.

The semiconductor packages discussed above (see FIGS. 1-2) are particular useful in the design of memory devices, processors, and computer systems. For example, referring to FIG. 3, a block diagram of a system employing the semiconductor packages in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor package as discussed above with reference to FIGS. 1-2. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor package as discussed above with relation to FIGS. 1-2, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data. Also, the memory devices 1350 may include a plurality of fuses arrayed therein.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 3 is merely one example of a system employing the semiconductor packages as discussed above with relation to FIGS. 1-2. In alternate embodiments, such as cellular phones or digital cameras, the components may differ from the embodiments illustrated in FIG. 3.

While various embodiments have been described above, it will be understood to those skilled in the art that the embodiments described are by way of example only. Accordingly, the semiconductor package described herein should not be limited based on the described embodiments.

What is claimed is:

1. A semiconductor package comprising:
   a first die;
   a second die disposed adjacent to the first die;
   a plurality of pads configured for receiving and outputting data mask addresses; and
   mapping blocks configured to map data mask signals among the first die, the second die, and the plurality of pads in response to a received address.

2. The semiconductor package according to claim 1, wherein the first die and the second die are configured to operate in a write double mask mode,
   wherein the write double mask mode includes controlling the data mask signals in pairs.

3. The semiconductor package according to claim 1, wherein the first die and the second die are configured to operate in a write single mask mode,
   Wherein the write single mask mode includes controlling the data mask signals singly.

4. The semiconductor package according to claim 1, wherein, in the first die, data "0" and data "2" are used, and data "1" and data "3" are not used.

5. The semiconductor package according to claim 2, wherein, in the second die, data "0" and data "2" are used, and data "1" and data "3" are not used.

6. The semiconductor package according to claim 1, wherein the data "0" of the first die is mapped with data "0" of a first pad, and the data "2" of the first die is mapped with data "1" of a second pad.

7. The semiconductor package according to claim 1, wherein the data "2" of the second die is mapped with data "2" of a third pad, and the data "0" of the second die is mapped with data "3" of a fourth pad.

8. The semiconductor package according to claim 1, wherein a first package including the first die and the second die is configured to operate as a mirror function structure with respect to a second package.

9. The semiconductor package according to claim 1, wherein the mapping block comprises:
   buffering units configured to flip-flop the received address, and output a first address, second address, third address, and a fourth address;
   selection units configured to output the first address to the fourth address as a first data mask signal, second data mask signal, third data mask signal, and a fourth data mask signal in correspondence to a select signal; and
   multiplexing units configured to combine the first data mask signal to the fourth data mask signal in correspondence to a control signal, and output byte data of the first die and the second die.

10. The semiconductor package according to claim 9, wherein the buffering units comprise:
    a first buffering unit configured to flip-flop the received address, and output the first address and the second address; and
    a second buffering unit configured to flip-flop the received address, and output the third address and the fourth address.

11. The semiconductor package according to claim 9, wherein the selection units comprise:
    a first selecting section configured to output the first address and the second address as the first data mask signal in correspondence to the select signal;
    a second selecting section configured to output the first address and the second address as the second data mask signal in correspondence to the select signal;
    a third selecting section configured to output the third address and the fourth address as the third data mask signal in correspondence to the select signal; and
    a fourth selecting section configured to output the third address and the fourth address as the fourth data mask signal in correspondence to the select signal.

12. The semiconductor package according to claim 9, wherein the multiplexing units comprise:
    a first multiplexing section configured to output the first data mask signal and the fourth data mask signal as the data "0" of the first die and the second die in response to the control signal;
    a second multiplexing section configured to output the second data mask signal and the third data mask signal as the data "1" of the first die and the second die in response to the control signal;
    a third multiplexing section configured to output the third data mask signal and the second data mask signal as the data "2" of the first die and the second die in response to the control signal; and
    a fourth multiplexing section configured to output the fourth data mask signal and the first data mask signal as the data "3" of the first die and the second die in response to the control signal.

13. The semiconductor package according to claim 9, wherein, when the first die and the second die operate in the write double mask mode, the second address is enabled in the first die, and the fourth address is enabled in the second die.

14. The semiconductor package according to claim 9, wherein, when the first die and the second die operate in the write single mask mode, the first address and the second address are enabled in the first die, and the third address and the fourth address are enabled in the second die.

15. The semiconductor package according to claim 1, wherein the first die includes a X16 data width.

16. The semiconductor package according to claim 1, wherein the second die includes a X16 data width.

17. The semiconductor package according to claim 1, wherein the first die and the second die are realized as a double die package (DDP) including a X32 data width.

* * * * *